United States Patent [19]

Sooy et al.

[11] Patent Number: 4,829,661
[45] Date of Patent: May 16, 1989

[54] ELECTRONIC COMPONENT INSERTION MACHINE

[75] Inventors: Robert J. Sooy, Marblehead, Mass.; Rodney P. Jackson, Auburn, N.H.

[73] Assignee: Emhart Industries, Inc., Farmington, Conn.

[21] Appl. No.: 172,620

[22] Filed: Mar. 24, 1988

[51] Int. Cl.[4] .............................................. H05K 3/30
[52] U.S. Cl. ........................................ 29/741; 29/759; 414/780
[58] Field of Search .......................... 29/741, 739, 759; 414/780

[56] References Cited

U.S. PATENT DOCUMENTS

| 4,333,586 | 6/1982 | Stückler | 29/741 X |
| 4,733,459 | 3/1988 | Tateno | 29/741 |
| 4,753,382 | 6/1988 | Bajpai et al. | 227/99 |

Primary Examiner—Carl E. Hall
Attorney, Agent, or Firm—Spencer T. Smith

[57] ABSTRACT

A machine for inserting DIP components. A DIP component slides down a chute and onto a mandrel. A thruster advances to thrust the component against a stop which is secured to the mandrel. The precisely located component is gripped and the mandrel is retracted, whereupon component insertion takes place.

3 Claims, 1 Drawing Sheet

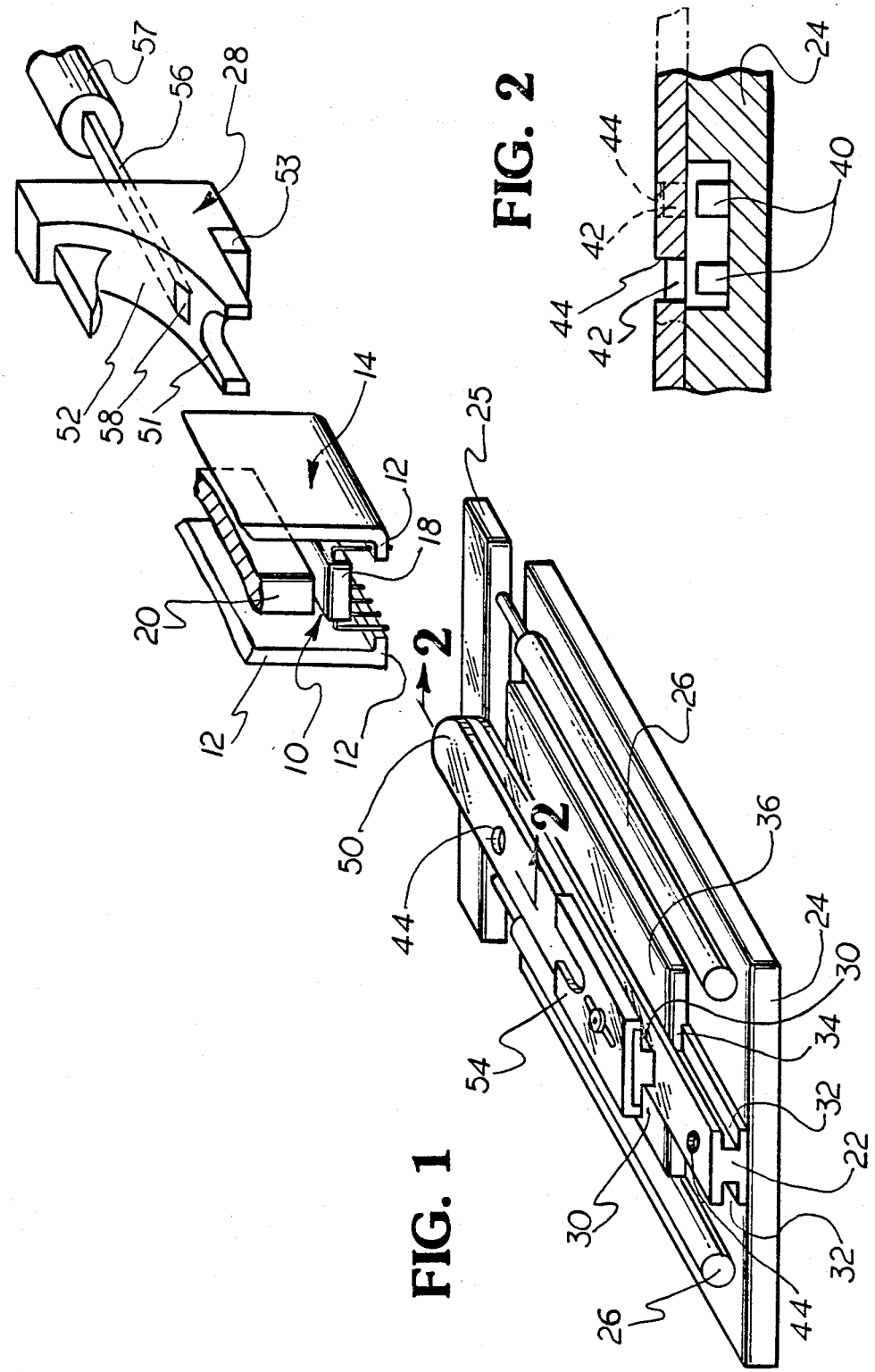

ELECTRONIC COMPONENT INSERTION MACHINE

A dual in-line package (DIP) component insertion machine inserts DIP components that may have up to twenty one (21) leads per side. In state-of-the-art machines such as disclosed in U.S. Pat. No. 3,550,238, each component is removed from a magazine and is delivered to a conditioning unit which forms or straightens the leads. The conditioned component is released to an arcuate chute which receives the component in a vertical orientation and re-orients the component to a substantially horizontal orientation before it is discharged from the chute onto a horizontal transfer mandrel. The momentum of the falling component carries the component forwardly along the mandrel to a selected location whereat the component is brought to a halt by a stop mechanism. The transfer mandrel then advances to a ready position. A spring biased pusher which is secured to the transfer mandrel pushes the component past the first stop positively locating the component against a final positioning stop mechanism. The component is then gripped by a finger mechanism, the transfer mandrel and separate stop mechanisms are retracted and the finger mechanism is lowered inserting the gripped component into a circuit board.

It is an object of the present invention to improve the component delivery mechanism for an electronic component insertion machine.

Other objects and advantages of the present invention will become apparent from the following portion of the specification and from the following drawings which illustrate in accordance with the mandate of the patent statutes a presently preferred embodiment incorporating the principles of the invention.

Referring to the drawings:

FIG. 1 is an oblique view of a portion of a DIP component insertion machine; and FIG. 2 is a view taken at 2—2 of FIG. 1.

The component insertion machine will sequentially locate components 10 (DIPs or sockets) at the illustrated ready position where the opposed jaws 12 of a gripper mechanism 14 will forcefully grip the opposed parallel leads of the DIP component. The body 18 of the DIP component will underlie the pusher element 20 of the gripper mechanism at the ready position. The gripper mechanism will be lowered, inserting the leads into holes in a receiving circuit board (not shown) whereupon the jaws will be retracted and the pusher will be further lowered to fully seat the component.

To locate the component 10 at the ready position, an elongated mandrel 22, which is slideably displaceable on a base 24 portion of the machine frame, and which is secured to a cross bar 25, is advanced by a pair of cylinders 26, or the like, from the illustrated retracted position to an advanced position where it engages the chute mechanism 28. The mandrel 22 has opposed upper 30 and lower 32 grooves defined in its side walls. The lower grooves 32 receive the tongue portion 34 of opposed guides 36, which are secured to the base, and the upper grooves 30 receive the innermost end portions of the opposed jaws 12, which extend inwardly beyond the lead of a gripped component. As can be seen from FIG. 2, a pair of Hall Effect Sensors 40 are located in the base 24 below the mandrel and sense the presence of magnets 42 secured within through-bores 44 defined in the mandrel. The mandrel can thereby be displaced between well-defined advanced and retracted positions. The forward end of the mandrel has a rounded projecting portion 50 which substantially mates with an arcuate cut-out 51 in the lower portion of the slide surface 52 of the chute mechanism 28 when the mandrel is advanced. A rubber bumper 53 is provided to cushion the impact of the advancing cross bar 25. When the mandrel is at the advanced position, the slide surface 52 and the top surface of the mandrel 22 form a continuous surface. A component dropped onto the chute will slide down the chute surface, which changes the orientation of the component from vertical to substantially horizontal, onto the mandrel. The component slides under the pusher 20, which prevents the component from jumping off the mandrel and towards a stop 54 which is secured to the top of the mandrel (the mandrel is at the advanced position). The component is precisely located against the stop 54 by advancing a spring biased thruster element 56 which is advanceable by a cylinder 57 from a retracted position where its forward end is located within a suitable hole 58 in the chute to an advanced position thrusting the component against the stop.

When the component is precisely located on the advanced mandrel, the gripping mechanism can be operated to grip the component. Once the component is gripped, the mandrel will be retracted so that the gripping mechanism can be partially lowered inserting the component into the circuit board. The fingers will then retract releasing the component and the pusher will engage and fully seat the component. A cut-clinch mechanism below the circuit board can then secure the component in place.

What is claimed is:

1. A machine for inserting DIP electronic components comprising:
   chute means, including a chute having a surface, for receiving a vertically oriented DIP component and for changing the vertical orientation of the received component to a substantially horizontal orientation;
   mandrel means including;
     an elongated transfer mandrel having a component receiving surface at the forward end thereof,
     means for supporting said mandrel for displacement from a retracted position whereat the front end of said mandrel is spaced from said chute surface to an advanced position whereat said component receiving surface of said mandrel is continuous with said chute surface, whereby a DIP component dropped onto said chute surface, when said mandrel is at said advanced position, will slide down said chute surface onto said mandrel surface,
     means for displacing said mandrel from said retracted position to said advanced position;
     stop means securely fastened to said mandrel a selected distance from said front end; and,
     said chute means further including thruster means for pushing a component which has slid down said chute onto said advanced mandrel against said stop.

2. An inserting machine according to claim 1, wherein said mandrel means further comprises a cross-bar secured to said mandrel and wherein said chute means further comprises a bumper for cushioning the impact of said cross-bar when said mandrel is advanced to said advanced position.

3. An inserting machine according to claim 2, wherein the front of said mandrel is rounded and wherein said chute has an arcuate cut-out for receiving said rounded front of the mandrel.

* * * * *